United States Patent [19]
Chakrabarti et al.

[11] Patent Number: 5,719,077
[45] Date of Patent: Feb. 17, 1998

[54] FIXTURE AND METHOD FOR LASER FABRICATION BY IN-SITU CLEAVING OF SEMICONDUCTOR BARS

[75] Inventors: Utpal Kumar Chakrabarti, Allentown, Pa.; Judith Francavilla de Jong, Suffern, N.Y.; Erdmann Frederick Schubert, Brookline, Mass.; James Dennis Wynn, Plainfield; George John Zydzik, Columbia, both of N.J.

[73] Assignee: Lucent Technologies Inc., Murray Hill, N.J.

[21] Appl. No.: 549,897

[22] Filed: Oct. 30, 1995

[51] Int. Cl.$^6$ ............................................. H01L 21/203
[52] U.S. Cl. .................... 438/129; 437/225; 118/715; 118/728; 118/729; 118/730; 225/101
[58] Field of Search ........................... 437/129, 225; 118/715, 728, 729, 730; 225/101

[56] References Cited

U.S. PATENT DOCUMENTS

| | | | |
|---|---|---|---|
| 5,063,173 | 11/1991 | Gasser et al. | 437/129 |
| 5,144,634 | 9/1992 | Gasser et al. | 372/49 |
| 5,154,333 | 10/1992 | Bauer et al. | 225/1 |
| 5,171,717 | 12/1992 | Broom et al. | 437/226 |

FOREIGN PATENT DOCUMENTS

0615824A1  2/1994  European Pat. Off. .

*Primary Examiner*—Richard Bueker
*Attorney, Agent, or Firm*—John M. Harman

[57] ABSTRACT

The invention is an apparatus and method for cleaving a semiconductor bar and coating the cleaved facets within a vacuum environment. The apparatus is a fixture having at least one rotator for cleaving one or more semiconductor samples into semiconductor bars and positioning the semiconductor bars for immediate coating of their cleaved facets. The fixture is operably positioned within a processing chamber and exposed to a conventional coating medium before, during or immediately after cleaving the semiconductor sample. The fixture cleaves the semiconductor samples in a manner that reduces semiconductor sample waste and also allows the processing environment requirements to be reduced compared to other cleaving and coating techniques. A single actuation feed-through mechanism actuates the fixture from outside of the processing chamber.

24 Claims, 9 Drawing Sheets

FIXTURE AND METHOD FOR LASER FABRICATION BY IN-SITU CLEAVING OF SEMICONDUCTOR BARS

BACKGROUND OF THE INVENTION

1. Field of the Invention

The invention relates to semiconductor lasers. More particularly, the invention relates to cleaving semiconductor wafers and coating the resulting cleaved facets.

2. Description of the Related Art

Semiconductor laser facets are essentially atomically flat, semiconductor surfaces produced by cleaving a semiconductor sample along a cleaving plane. The semiconductor-air interface occurring at the facet partially reflects light due to the difference in refractive index between the semiconductor and the adjacent air. Therefore, the facets can be used as reflectors in semiconductor diode lasers.

Semiconductors having two such facets are called Fabry-Perot lasers in analogy to Fabry-Perot cavities, which have two co-planar reflectors. Fabry-Perot diode lasers are one of the most common of all semiconductor lasers and are used as communication lasers with silica fibers, as compact-disc player lasers, as pump lasers for pumping Er-doped optical fiber amplifiers, and other applications such as monitoring atmospheric pollutants. Other types of lasers include the distributed feedback (DFB) lasers and the distributed Bragg reflector (DBR) lasers.

A common problem of Fabry-Perot lasers is the presence of electronic surface states at the laser facets, that is, at the semiconductor-air interface. Such electronic surface states typically are within the forbidden bandgap of semiconductors, which separates the allowed conduction band and the allowed valence band. In an ideal semiconductor, the forbidden gap does not contain any electronic states or gap states.

Gap states have many deleterious effects in semiconductors, including absorption. When using semiconductor devices in optoelectronic applications, for example, absorption processes are undesired, since they decrease the light intensity of the optoelectronic device. Furthermore, sufficiently high absorption at the semiconductor facet can cause structural damage to the facet.

The concentration of gap states is especially high at the semiconductor-air interface of semiconductors that are cleaved in a relatively uncontrolled ambient environment. The high concentration persists if the semiconductor laser facet is then coated with a dielectric, anti-reflective coating. However, the concentration of surface states is reduced by cleaving semiconductors in a highly controlled ambient environment, such as in an ultra-high vacuum, and this low concentration of surface states is preserved by subsequently coating the facet with a dielectric film.

Many devices exist in the art for cleaving semiconductor bars in an ultra-high vacuum (UHV) environment and then subsequently coating the cleaved facets. See, for example, U.S. Pat. Nos. 5,063,173 and 5,144,634, both issued to Gasser et al., whereby mechanical movements of a tip (29) and a series of 180 degree rotations cleave the outer portions of a semiconductor bar and coat the cleaved facets. Also, see U.S. Pat. No. 5,171,717, issued to Broom et al., which discloses a method in which a pair of flexible transport bands guide a semiconductor bar around a curved, large radius surface thereby applying a bending moment of magnitude sufficient to cleave the semiconductor bar. The transport bands also deliver the cleaved bars to an appropriate area for passivation layer deposition.

In U.S. Pat. No. 5,154,333, issued to Bauer et al., a cleavage method and apparatus for multi-bar semiconductors is disclosed that uses motor driven micrometers for incremental alignment of a multi-bar semiconductor, a controlled load using pole-shaped jaws and rotational force to propagate the cleave, and a second load using pole-shaped jaws to complete the cleave. Upon completion of cleaving, the multiple bars are collected in a carder device for robotic transfer to a coating operation using, e.g., the transferring device disclosed in EPO 0 615 824 A1.

Although cleaving semiconductor bars and coating the cleaved facets in UHV environments are known, the existing equipment can be inefficient, cumbersome and complicated, and many involve mechanisms that are not easily compatible with a UHV environment.

It is desirable to have available an improved fixture and method for cleaving semiconductor devices and coating the cleaved facets immediately after cleaving.

SUMMARY OF THE INVENTION

According to its major aspects and broadly stated, the invention is an apparatus and method for processing a laser within a high vacuum environment. In particular, it is a fixture having at least one rotator for cleaving one or more semiconductor samples into semiconductor bars and positioning the semiconductor bars for immediate coating of their cleaved facets. The fixture is operably positioned within a processing chamber and exposed to a conventional coating medium before, during or immediately after cleaving the semiconductor sample. The fixture cleaves the semiconductor samples in a manner that reduces semiconductor sample waste and also allows the processing environment requirements to be reduced compared to other cleaving and coating techniques. A single actuation feed-through mechanism actuates the fixture from outside of the processing chamber.

3

Figure 7A:
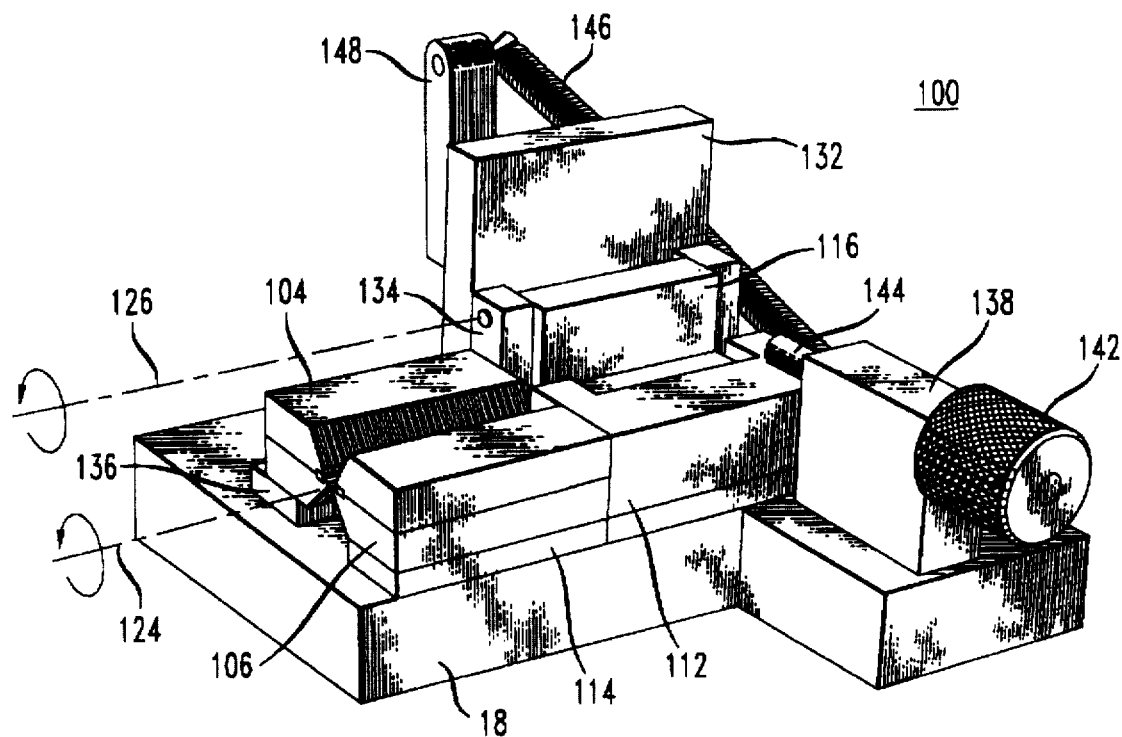
FIG. 7a is a perspective view of a semiconductor cleaving fixture according to another embodiment of the invention prior to operation.
Figure 8A:
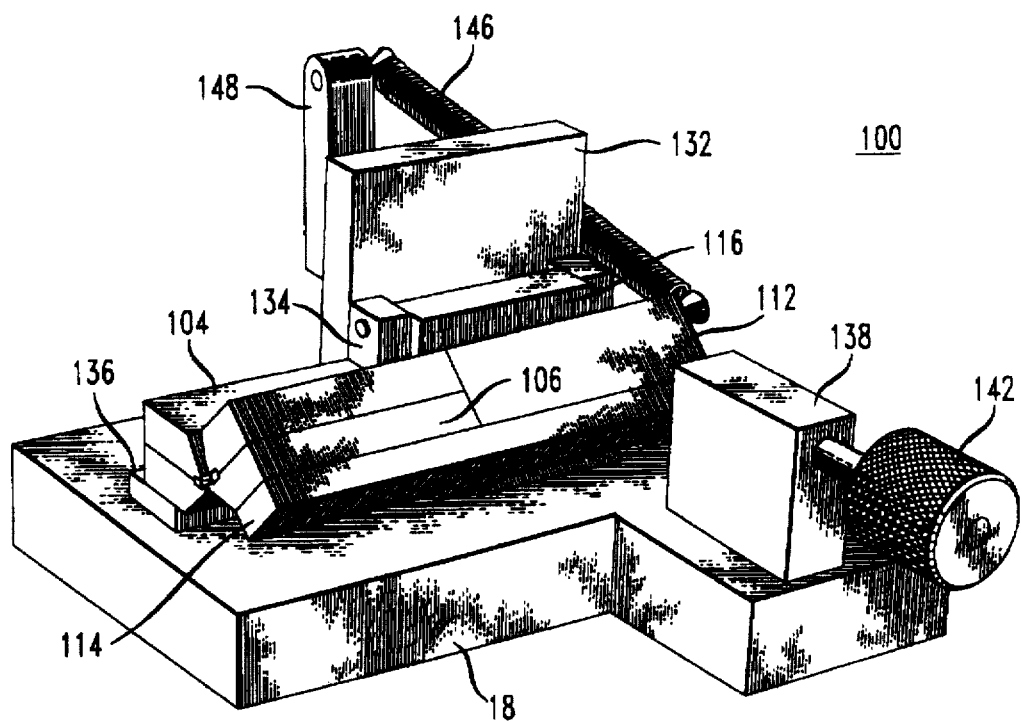
FIG. 8a is a perspective view of the fixture of FIG. 7a during cleaving and positioning rotation about a first axis of rotation.
Figure 8B:
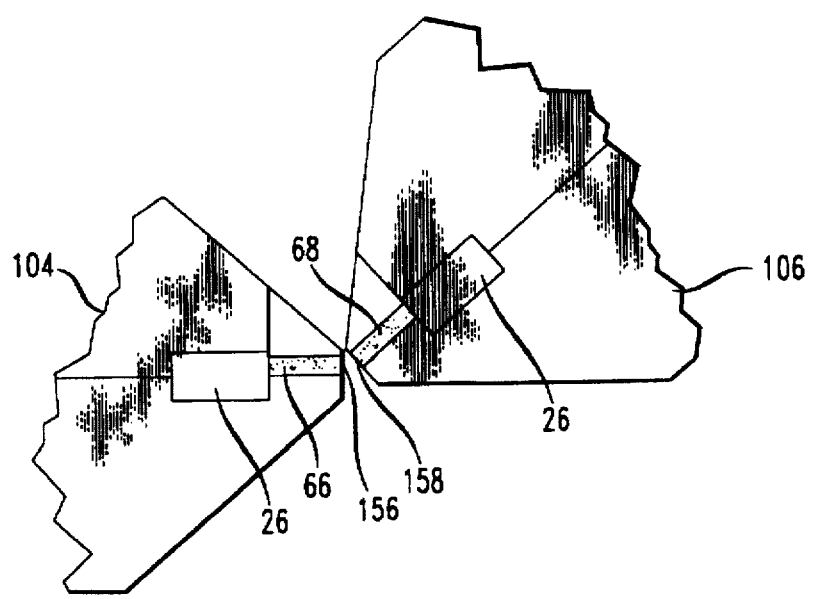
Figure 9A:
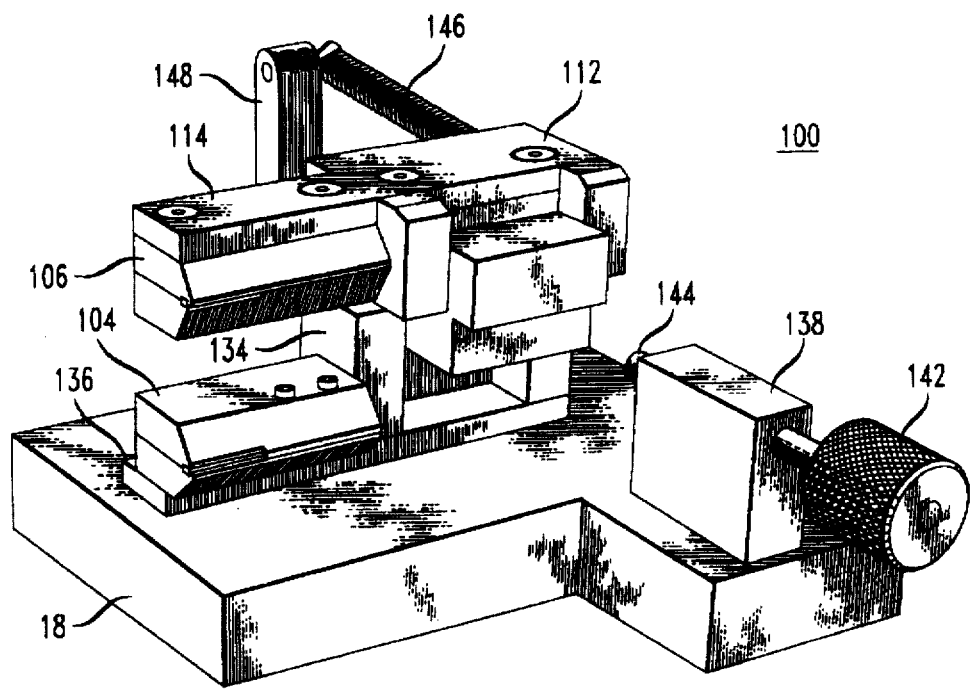
Figure 9B:
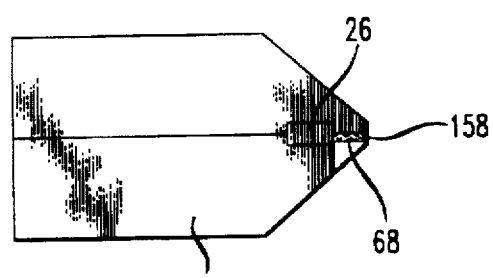

FIG. 8b is a partial end view of the jaws as shown in FIG. 8a;

FIG. 9a is a perspective view of the fixture of FIG. 7a upon conclusion of positioning rotation about a second axis of rotation; and FIG. 9b is partial end view of the jaws as shown in FIG. 9a.

DETAILED DESCRIPTION

In the following description similar components are referred to by the same reference numeral in order to simplify the sequential aspect of the drawings.

Figure 1:
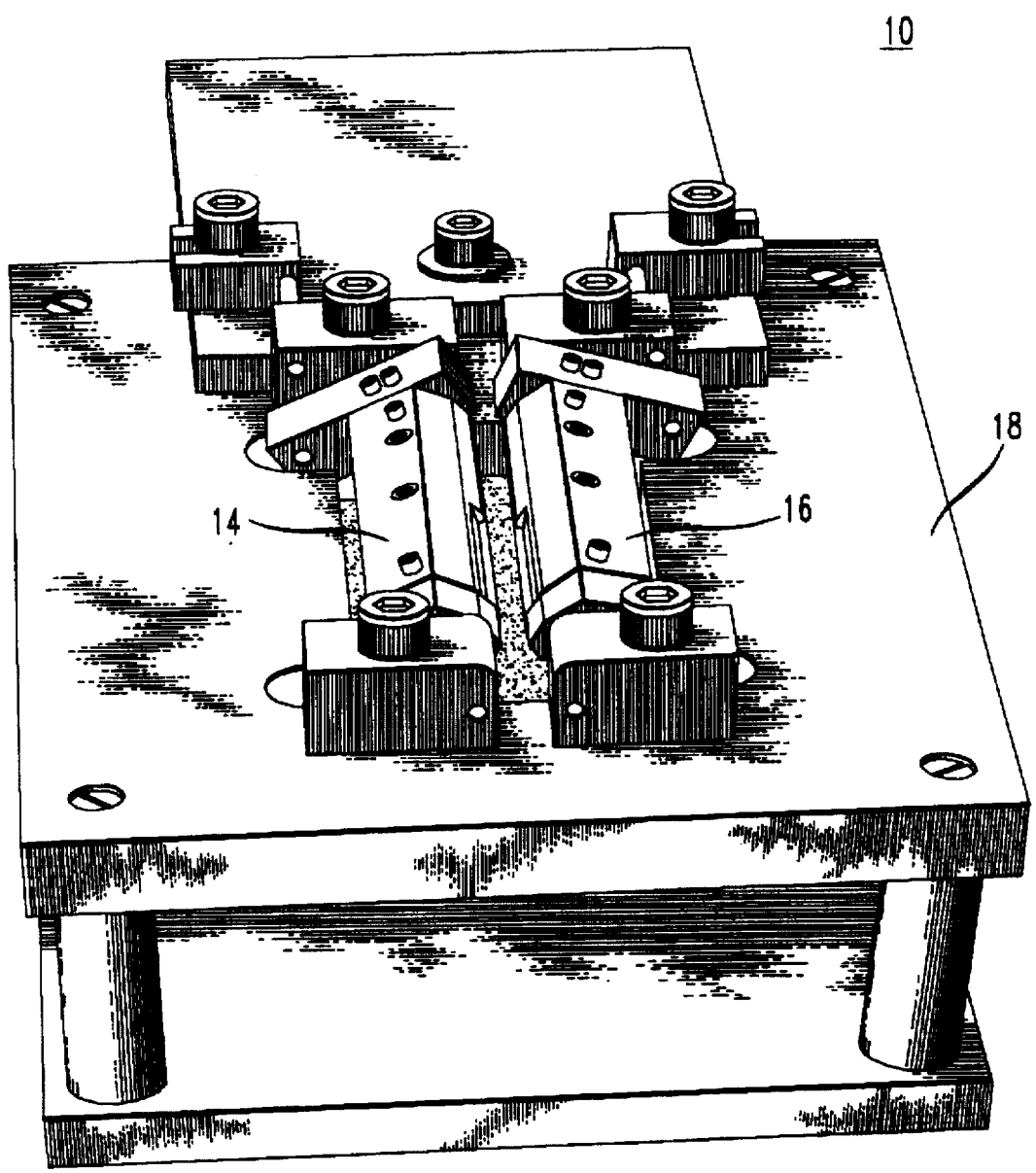
FIG. 1 is a perspective view of a semiconductor cleaving fixture according to an embodiment of the invention.

Referring now to FIG. 1, a semiconductor cleaving fixture 10 according to an embodiment of the invention is shown. In general, fixture 10 comprises one or more rotators, such as jaws 14 and 16, mounted on a flame 18 made of stainless steel or other suitable material. Jaws 14, 16 each hold an opposing side of a semiconductor sample (e.g., a double-wide semiconductor sample) and, through one or more rotation arrangements, cleave the semiconductor sample into, for example, single-wide semiconductor bars whose fleshly cleaved facets are positioned so that they can be coated immediately. Furthermore, the operation of fixture 10 is such that, in novel combination with conventional coating techniques, a semiconductor sample can be cleaved and coated in less than approximately 1.0 seconds, typically less than 0.5 seconds. As will be discussed in greater detail later, the ability of fixture 10 to perform rapidly and immediately with conventional coating expedients provides a number of advantages over other cleaving devices.

Figure 2A:
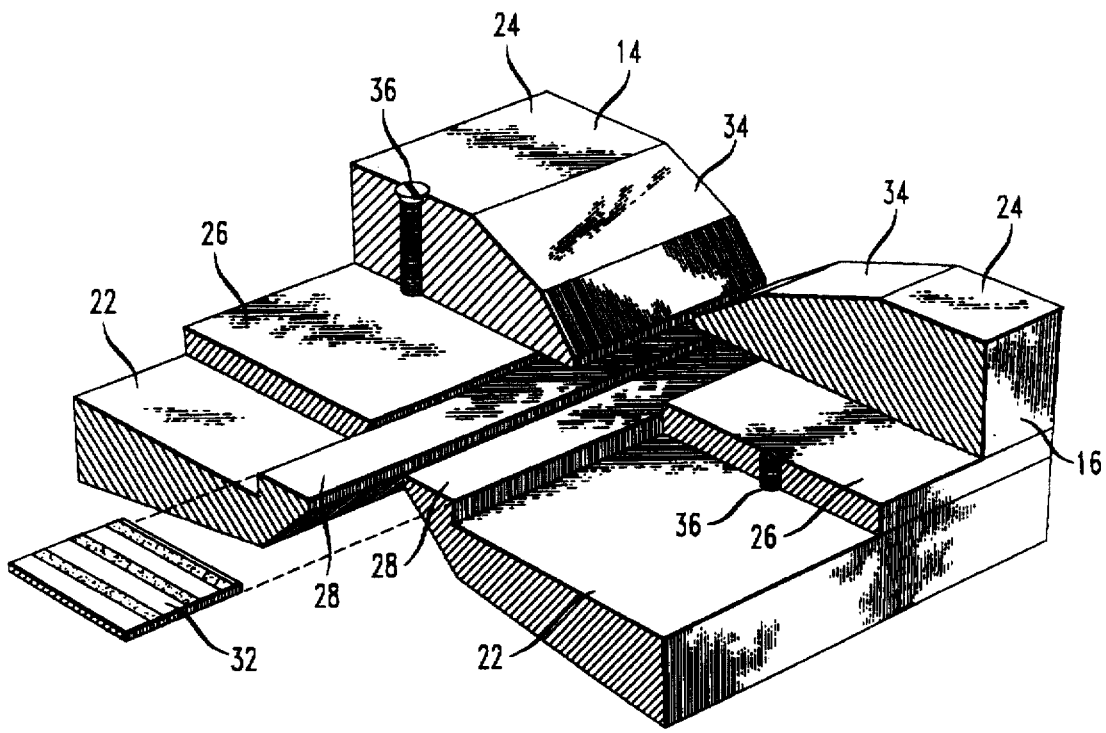
FIG. 2a is a partial cut-away perspective view of the jaws or faces used in the invention for alignment and positioning of a semiconductor sample therebetween.
Figure 2B:
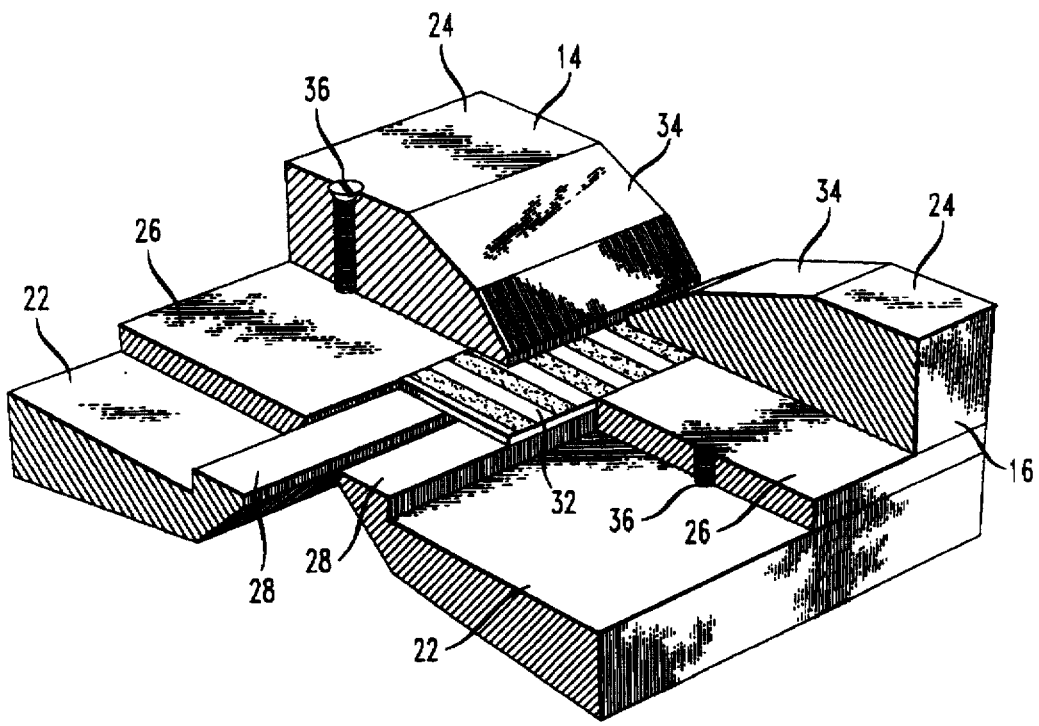
FIG. 2b is a partial cut-away perspective view of the jaws or faces used in the invention showing the semiconductor sample aligned and positioned therebetween.

Initial discussion of fixture 10 begins with rotators, such as jaws 14 and 16, which are partially shown in detail in FIGS. 2a–2b. Each of jaws 14, 16 comprises a lower face 22, a corresponding upper face 24, and at least one alignment plate 26 dimensioned to fit therebetween. Each lower face 22 has an elevated surface portion 28 thereof that combines with alignment plates 26 to support and align a semiconductor sample 32 between jaws 14, 16 as shown. Each upper face 24 has a slanted region 34 to better accommodate rotational movement of jaws 14, 16 with respect to one another, as will be discussed later.

Lower faces 22 of jaws 14, 16 are made of stainless steel or other suitable material. Upper faces 24 of jaws 14, 16 are made of Teflon®, Delrin™ or equivalent soft material that does not impress into semiconductor sample 32 when fastened thereon. Alignment plates 26 are made of stainless steel or other suitable, non-corrosive material.

Typically, each semiconductor sample 32 to be cleaved is considered a double bar. That is, to produce a single bar having dimensions of approximately 9 mm long×750 μm wide×125 μm thick, each semiconductor sample 32 is approximately 1500 μm wide prior to cleaving. Although in this description only one semiconductor sample is shown being cleaved, jaws 14, 16 can be made to hold multiple semiconductor samples therebetween for cleaving thereof.

Furthermore, jaws 14, 16 can be made to accommodate laser samples of quadruple width (i.e., approximately 3000 μm prior to cleaving). With these laser samples, sequential cleaving occurs, i.e., cleaving the quadruple bars into double bars and coating their cleaved facets and then cleaving the double bars into single bars and coating the cleaved facets. In this manner, semiconductor samples are fabricated that have an in-vacuum cleaved and coated front (low-reflectivity or light exit) facet and rear (high-reflectivity) facet.

When positioned as desired, semiconductor sample 32 is positioned generally in the center between surface portions

4

28 due to appropriate positioning of alignment plates 26. Once semiconductor sample 32 and alignment plates 26 are positioned on lower faces 22, upper faces 24 are operably positioned over and fastened to alignment plates 26 and lower faces 22 by a connector 36 such as a screw or other fastening instrument.

Figure 3:
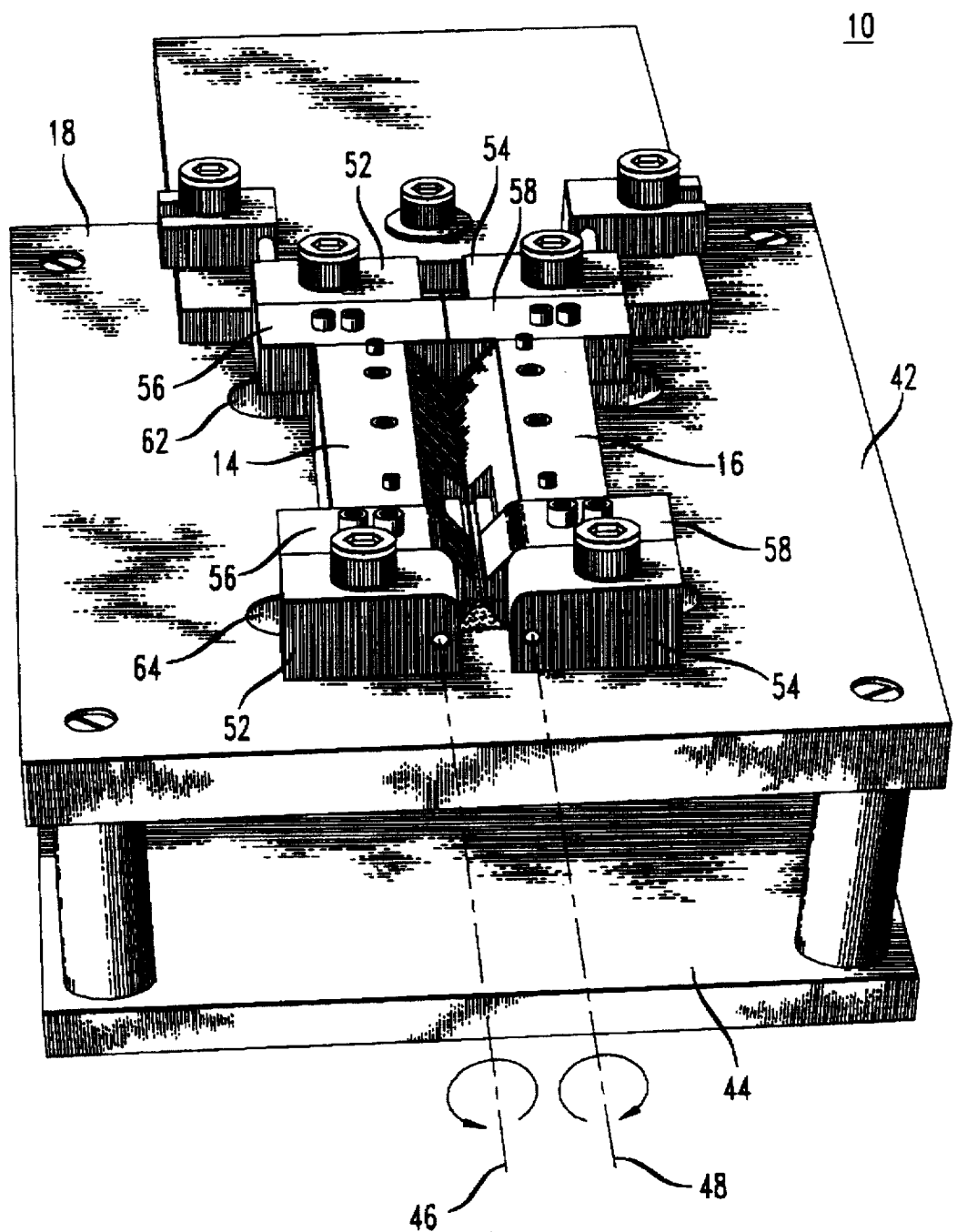
FIG. 3 is an end perspective view of a semiconductor cleaving fixture according to an embodiment of the invention prior to operation.
Figure 4:
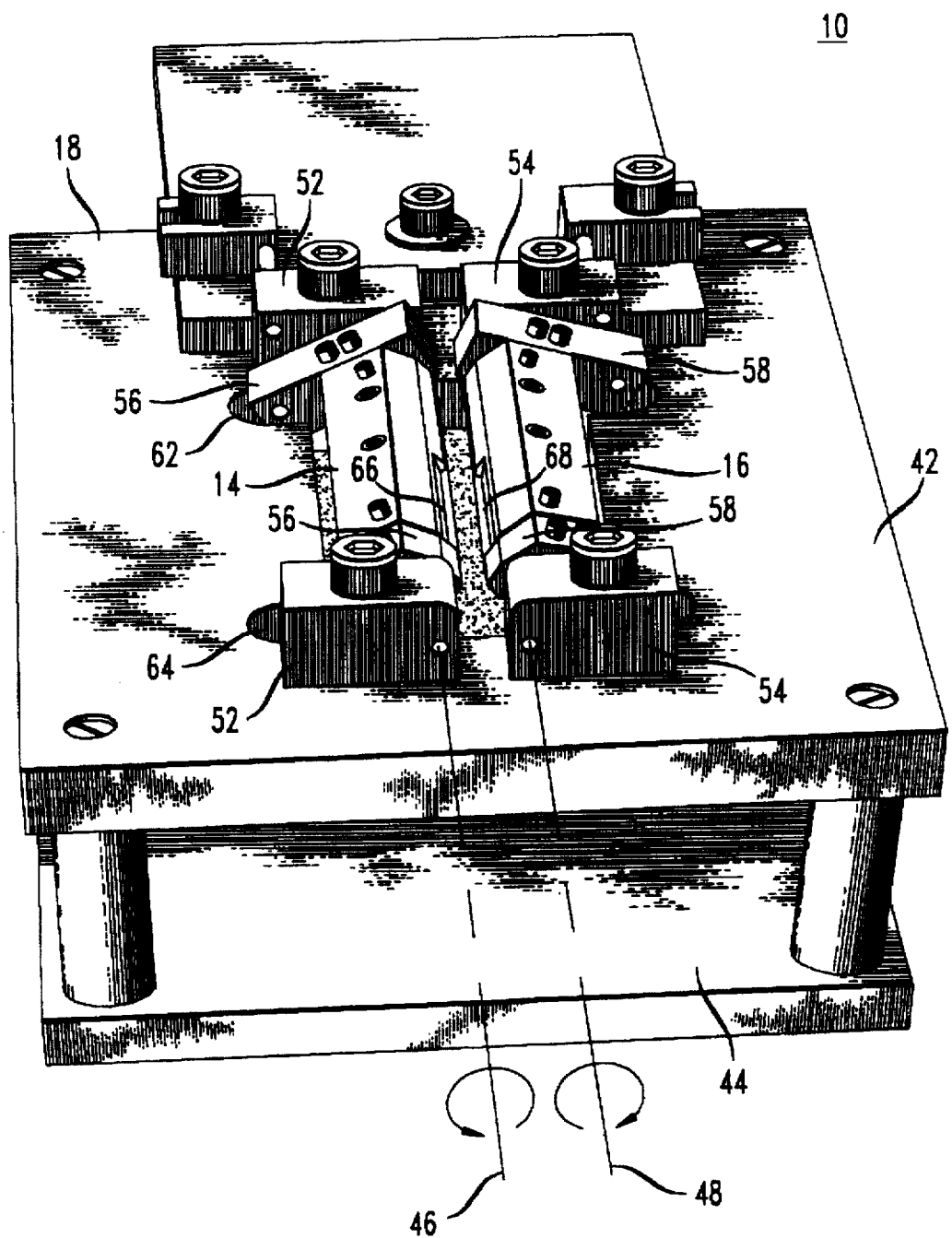
FIG. 4 is an end perspective view of the fixture of FIG. 3 during cleaving and positioning rotation of the jaws.
Figure 5:
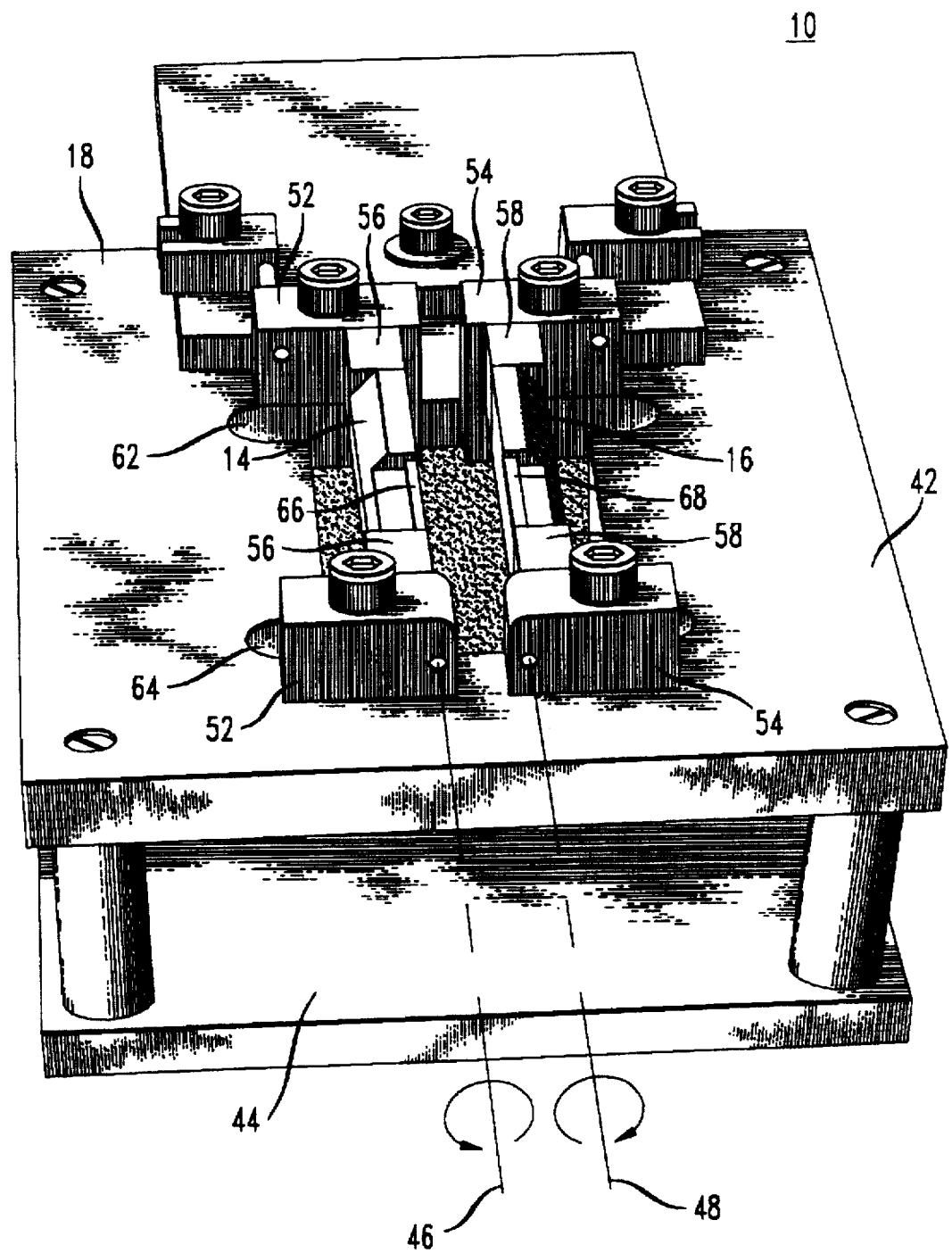
FIG. 5 is an end perspective view of the fixture of FIG. 3 as the fixture is positioning the cleaved facets for coating.

Referring now to FIGS. 3–5, one embodiment of the invention is shown. In this embodiment, both jaws 14, 16 are rotatably mounted to an upper surface 42 of frame 18. By comparison, in another embodiment of the invention shown in FIGS. 7–9 and discussed in greater detail later, one jaw is rotatably connected and one jaw is fixably connected to the upper surface of the frame.

In the embodiment shown in FIGS. 3–5, upper surface 42 is spaced a desired distance above a lower surface 44 of frame 18. Jaws 14, 16 are rotatably mounted on upper surface 42 of frame 18 about axes of rotation 46, 48, respectively, e.g., via mounts 52, 54 and endpieces 56, 58. Axes of rotation 46, 48 are oriented as close to one another as possible, typically within a range of approximately ⅛ to ⅜ of an inch apart. However, it is clear to those skilled in the art that modifications to this orientation are possible and based on the desired application of fixture 10.

Jaws 14, 16 are fixably connected to endpieces 56, 58, respectively, which are in turn rotatably connected to mounts 52, 54, respectively. Mounts 52, 54 are fixably connected to upper surface 42.

In general, the typical range of rotation of jaws 14, 16 in this embodiment is illustrated sequentially by FIGS. 3, 4 and 5. As shown, jaws 14, 16 rotate in opposite directions with respect to one another about their respective axes of rotation 46, 48. For example, from the view shown in FIGS. 3–5, jaw 14 can rotate about axis of rotation 46 in a counterclockwise direction, as shown, and jaw 16 can rotate about axis of rotation 48 in a clockwise direction, as shown.

FIG. 3 shows fixture 10 prior to operation. Jaws 14, 16 are generally aligned and face one another so that a semiconductor sample is held therebetween, as shown previously in FIG. 2b. As mentioned previously, the semiconductor sample includes at least one semiconductor sheet having dimensions suitable for being operably positioned between jaws 14, 16.

Figure 6:
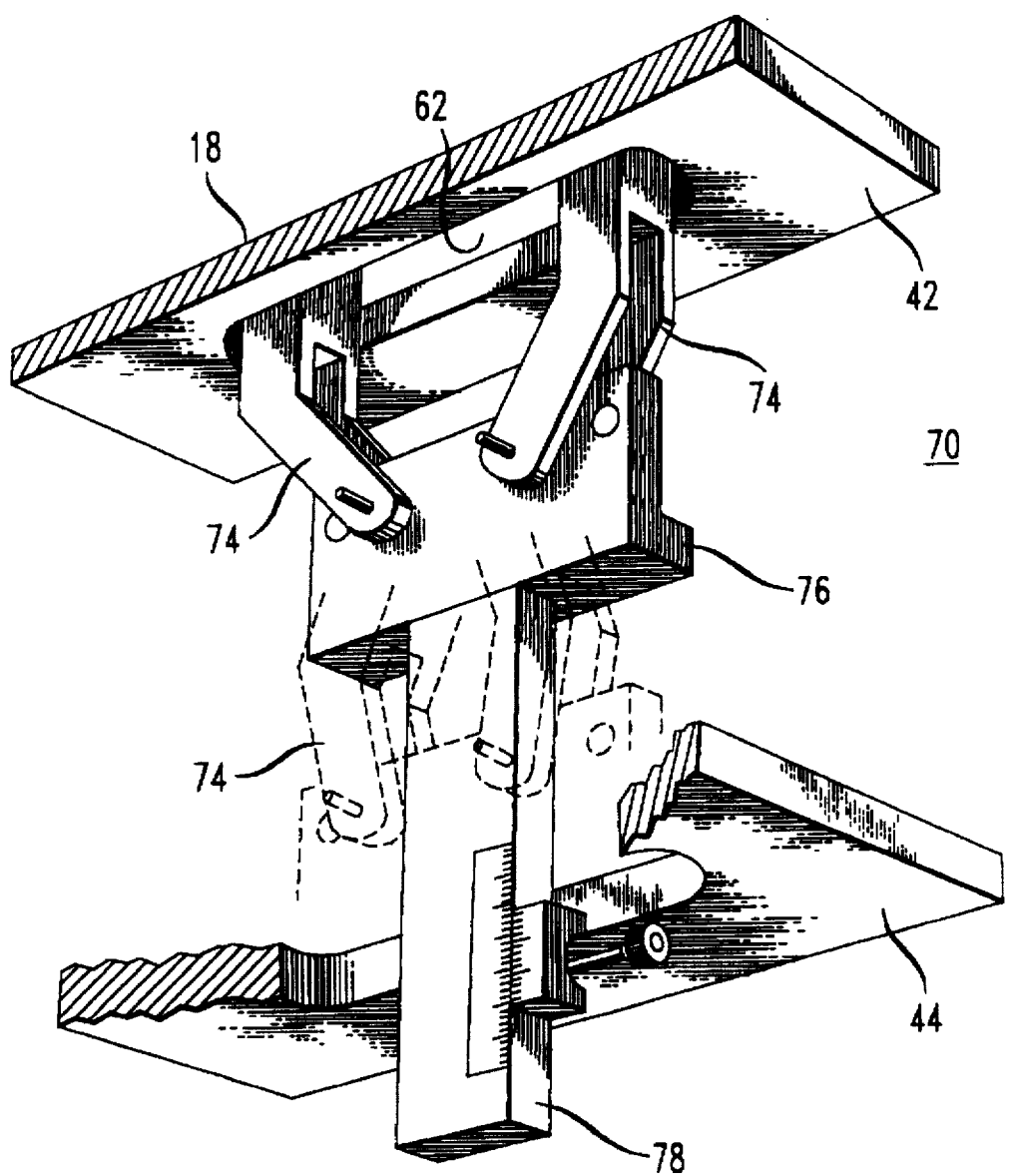
FIG. 6 is a partial perspective view of an actuating mechanism for use with the fixture of FIG. 3.

FIG. 4 shows fixture 10 during operation in which jaws 14, 16 have rotated slightly, although sufficiently, to cleave the semiconductor sample. Upper surface 42 of frame 18 has patterned openings 62, 64 formed therethrough to allow connection of endpieces 56, 58 to an actuator positioned below upper surface 42 (one type of which is shown in FIG. 6 and discussed later). Also, because a portion of jaws 14, 16 and endpieces 56, 58 move toward lower surface 44 during operable rotation, openings 62, 64 are dimensioned so that endpieces 56, 58 and jaws 14, 16 enjoy freedom of movement during such rotation.

As jaws 14, 16 are rotated slightly in their respective directions, as discussed previously, the semiconductor sample is cleaved thereby forming separate semiconductor bars (e.g., bars 66, 68 shown generally in FIGS. 4, 5), each having respective high quality, cleaved facets. Also, unlike other semiconductor cleaving devices and techniques, cleaving the semiconductor sample in the manner described herein does not waste any portion of the semiconductor sample.

Finally, with respect to this embodiment of the invention, FIG. 6 shows a perspective view of one kind of an actuating mechanism 70 used in fixture 10 from a view underneath surfaces 42, 44 of frame 18. Actuating mechanism 70 has at least one pair of arms 74 operably connected at one end to a movement plate 76 and at the other end through upper surface 42 of frame 18 to jaws 14, 16 and/or endpieces 56, 58 (not shown in FIG. 6). Operably connected to the other end of movement plate 76 is an actuating arm 78 that extends through lower surface 44 of frame 18.

Rotation of endpieces 56, 58, and consequently rotation of jaws 14, 16, is actuated through linear movement of actuating arm 78. Arms 74 translate this linear movement into rotational movement of jaws 14, 16 about axes of rotation 46, 48, respectively, as discussed previously and shown in FIGS. 3–5.

In use, fixture 10 is positioned within a processing environment, e.g., within a vacuum chamber maintaining a vacuum environment, either prior to or after the semiconductor sample is operably positioned between jaws 14, 16 as shown in FIG. 2b and described previously. Upon actuation by an actuator (such as the one shown in FIG. 6), jaws 14, 16 rotate in opposite directions about their respective axes of rotation in the manner discussed previously, thereby cleaving the semiconductor sample into semiconductor bars 66, 68.

Continued rotation of jaws 14, 16 positions semiconductor bars 66, 68 so that their freshly cleaved facets are oriented approximately parallel with respect to one another. The cleaved facets are coated using conventional coating means (not shown), such as vacuum deposition, e-beam evaporation and the like. Other suitable coating means include electron-beam evaporation, which will not be described in detail since it is well known in the art. See, for example, "Handbook of Thin Film Technology", edited by L. I. Maissel and R. Glang (McGraw-Hill, 1970).

The coating process can begin immediately after cleaving and desirably positioning the cleaved semiconductor bars, which itself is completed in less than 1.0 seconds. Also, because of their positioning, the cleaved facets are coated at essentially the same time. Thus, the all-important amount of time between cleaving and coating the cleaved facets is significantly reduced, by as much as 10–100× that of other techniques.

Alternatively, to further reduce and essentially eliminate the amount of time between cleaving the sample and coating the cleaved facets (i.e., the exposure time of the cleaved facets to the residual atmosphere in the processing chamber), the cleaving/coating process is modified such that the coating medium (e.g., Si from an evaporation source) is present in the processing chamber before cleaving begins. For instance, a protective shutter between the coating medium and the semiconductor sample is removed just prior to cleavage, exposing the sample to the coating medium before and during cleavage, thereby essentially eliminating exposure of uncoated cleaved facets to the residual atmosphere.

However, in such case, jaws 14, 16 are operably positioned as close to each other as possible when holding semiconductor sample 32 to minimize unnecessary coating of semiconductor sample 32 at the cleaving facet location prior to cleaving. Typically, jaws 14, 16 are operably spaced approximately 1–2 µm apart prior to operation.

Although this modification of the cleaving/coating process is herein discussed for practice in a process that utilizes the above-discussed fixture, those skilled in the art will appreciate that the modification is not thus limited. Indeed, we believe that the modification of the cleaving/coating process can be advantageously used with substantially any cleavage fixture.

As a consequence of the minimized or significantly reduced exposure time of the cleaved facets prior to being coated, the environmental requirements of other techniques can be relaxed in the invention described herein without diminishing the quality of the cleaved and coated semiconductor bars. Specifically, the ultra-high vacuum (UHV) environment ($10^{-9}$ to $10^{-10}$ torr) required in other techniques of this kind can be relaxed to that of a high vacuum (HV) environment ($10^{-6}$ to $10^{-7}$ torr) in the invention described herein. This environment relaxation is a huge advantage in terms of equipment and labor costs, set-up times and the like because a UHV environment is much more expensive to establish and maintain and much more difficult to work in because of the ease with which contamination can occur. By comparison, an HV environment is a typical working environment within this art and is much easier and cost effective to establish, maintain and perform experimentation within.

Figure 9B:
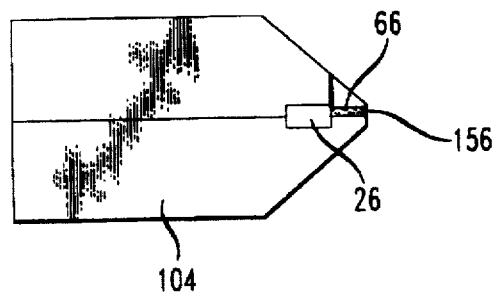

In another embodiment of the invention, shown in FIGS. 7–9, a semiconductor cleaving fixture 100 has a first or fixed jaw 104 fixably connected to frame 18 and a second or rotatable jaw 106 rotatably connected to frame 18. Rotatable jaw 106 is connected to frame 18 about two generally parallel axes of rotation via, for example, a double-hinged joint or other suitable arrangement. As shown, rotatable jaw 106 is fixably connected to an endpiece 112 and a lower plate 114, which are rotatably connected about a first axis of rotation 124 to the lower portion of an arm 116. The upper portion of arm 116 is rotatably connected about a second axis of rotation 126 to a support 132, which is fixably connected to frame 18. Fixed jaw 104 is fixably connected to a lower portion 134 of support 132 and supported by a lower plate 136, as shown.

The typical range of motion of rotatable jaw 106 is depicted generally in FIGS. 7, 8 and 9. Initially, rotatable jaw 106 rotates about first axis of rotation 124 to cleave semiconductor sample 32. Then, rotatable jaw 106 rotates about second axis of rotation 126 so that the freshly cleaved facet held by rotatable jaw 106 is approximately parallel with the freshly cleaved facet held in fixed rotatable jaw 106.

Figure 7B:
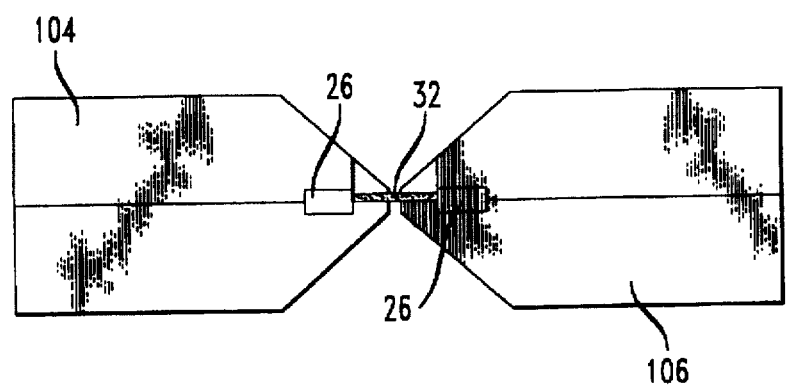
FIG. 7b is a partial end view of the jaws of the fixture of FIG. 7a prior to operation.

FIGS. 7a and 7b show this embodiment of the invention prior to operation. As shown, in its initial position, rotatable jaw 106 is generally aligned with and facing fixed jaw 104 so that semiconductor sample 32 is held therebetween with alignment plates 26 in the manner described previously. Fixed jaw 104 is supported by lower plate 136, similar to lower plate 114 supporting rotatable jaw 106.

FIGS. 8a and 8b show fixture 100 during the cleaving rotation of rotatable jaw 106 about first axis of rotation 124 just prior to rotatable jaw 106 reaching a first position approximately 90 degrees with respect to its original position shown in FIGS. 7a and 7b. Rotatable jaw 106 initially rotates about first axis of rotation 124 whereby lower plate 114 moves toward fixed jaw 104 (i.e., in a clockwise direction from the view shown in FIGS. 7b and 8b). This initial rotation is sufficient to cleave semiconductor sample 32 into semiconductor bars having cleaved facets 156, 158, respectively, and is completed when endpiece 112 approaches or abuts arm 116.

Then, rotatable jaw 106 begins rotation about second axis of rotation 126. In this rotation, rotatable jaw 106 moves from the first position to a second position in which it is oriented so that freshly cleaved facets 156 and 158 are approximately parallel with respect to one another. FIGS. 9a and 9b show fixture 100 once this rotation has been completed.

Finally, with respect to this embodiment of the invention, one suitable actuating mechanism (shown generally as 138) is shown throughout FIGS. 7–9. Actuating mechanism 138 is a single movement actuating means having a handle 142 fixably connected to a shaft or rod 144. A spring 146 having one end connected to endpiece 112 (shown best in FIG. 8a) and the other end connected to a spring arm 148 mounted on support 132 biases endpiece 112 and rotatable jaw 106 toward support 132. Although actuating mechanism 138 shown here is spring-loaded, fixture 100 is adaptable for use with any suitable feed-through actuating mechanism, such as a linearly sliding arm or a rotating handle feed-through.

In use, semiconductor sample 32 is operably positioned between jaws 104, 106 in a manner shown in FIG. 7b and described previously either prior to or after fixture 100 is positioned within a processing environment, e.g., a vacuum chamber maintaining an HV environment ($10^{-6}$ to $10^{-7}$ torr). Upon actuation, e.g. by actuating mechanism 138, rotatable jaw 106 (along with endpiece 112) rotates about first axis of rotation 124 toward its first position in the manner described previously to cleave semiconductor sample 32 into semiconductor bars 66, 68, thereby producing cleaved facets 156, 158, respectively.

Once rotatable jaw 106 has reached its first position, rotatable jaw 106 (along with endpiece 112 and arm 116) begins rotation about second axis of rotation 126 toward its second position shown in FIGS. 9a and 9b. As discussed previously, when rotatable jaw 106 reaches its second position, semiconductor bars 66, 68 are positioned so that their respective cleaved facets 156, 158 are approximately parallel with respect to one another.

The entire rotation process of rotatable jaw 106 from its original position to its second and final position takes less than approximately 1.00 seconds, typically between approximately 0.05 and 0.50 seconds. Cleaved facets 156, 158 are coated together using a conventional coating means residing within the vacuum environment. As discussed with the previous embodiment, the coating means is put into operation prior to, during or immediately after semiconductor sample 32 is cleaved.

It will be apparent to those skilled in the art that many changes and substitutions can be made to semiconductor cleaving fixtures herein described without departing from the spirit and scope of the instant as defined by the appended claims.

What is claimed is:

1. Apparatus for processing a laser, said apparatus for use with at least one semiconductor sample each having at least one cleaving plane, each cleaving plane having a first semiconductor side with respect to said cleaving plane and an opposing second semiconductor side with respect to said cleaving plane, said apparatus comprising:

a frame;

at least one rotator operably connected to said frame and adapted for holding said first and second sides of said semiconductor sample, said rotator adapted for rotating said first and second sides of said semiconductor sample with respect to one another to cleave said semiconductor sample along said cleaving plane thereby forming a first semiconductor bar having a first cleaved facet and a second semiconductor bar having a second cleaved facet at each of said cleaving planes and then to position said first and second semiconductor bars so that said first and second cleaved facets can be coated without further movement; and an actuator for rotating at least a portion of said rotator.

2. The apparatus as recited in claim 1, wherein said rotator can position said first and second semiconductor bars so that said first and second cleaved facets are approximately parallel with respect to one another.

3. The apparatus as recited in claim 1, wherein said rotator further comprises at least one pair of jaws, each of said jaws having an upper face and a lower face for holding a portion of said semiconductor sample therebetween.

4. The apparatus as recited in claim 1, wherein said rotator can rotate said first and second sides of said semiconductor sample with respect to one another so that at least said first semiconductor side rotates to a first position whereby said first cleaved facet is approximately perpendicular to said second cleaved facet, and then rotates from said first position to a second position whereby said first cleaved facet is approximately parallel with respect to said second cleaved facet.

5. The apparatus as recited in claim 1, wherein said frame and said at least one rotator operate within a high vacuum environment of approximately $10^{-7}$ torr or more.

6. Apparatus for processing a laser, said apparatus for use with a coating former for forming a coating on cleaved surfaces and with a semiconductor sample having at least one cleaving plane between a first side and an opposing second side, said apparatus comprising:

a frame;

at least one jaw connected to said frame and dimensioned to hold at least said first side of said semiconductor sample therebetween;

said at least one jaw being rotatable with respect to each cleaving plane so that said semiconductor sample can be cleaved along each cleaving plane into a first semiconductor bar having a first cleaved facet and a second semiconductor bar having a second cleaved facet and so that said first and second semiconductor bars can be positioned whereby said first and second cleaved facets can be coated by said coating former while said semiconductor bars are still being held by said at least one jaw; and an actuator for rotating said at least one jaw.

7. The apparatus as recited in claim 6, wherein said at least one jaw further comprises first and second jaws rotatable with respect to one another whereby at least one of said jaws rotates to a first position with respect to the other jaw so that said semiconductor sample is cleaved and then rotates to a second position with respect to the other jaw so that said first and second semiconductor bars are positioned whereby said first and second cleaved facets are approximately parallel with respect to each other.

8. The apparatus as recited in claim 6, wherein said at least one jaw further comprises first and second jaws rotatably connected to said frame, wherein each of said first and second jaws have a first position, and wherein said actuator rotates said first and second jaws in opposite directions whereby each of said jaws is rotated with respect to its first position, said rotation of said jaws cleaving said semiconductor sample and then positioning said first and second semiconductor bars so that said first and second cleaved facets can be coated by said coating former without further movement of said semiconductor bars.

9. The apparatus as recited in claim 6, wherein said at least one jaw further comprises first and second jaws rotatably connected to said frame and wherein said actuator rotates said first jaw about a first axis of rotation in a first direction and rotates said second jaw about a second axis of rotation parallel to said first axis of rotation in a second direction opposite from said first direction.

10. The apparatus as recited in claim 6, wherein said at least one jaw further comprises a first jaw fixably connected to said frame and a second jaw, and wherein said frame includes a double-hinged joint operably connected to said second jaw, said double-hinged joint having a first axis of rotation for allowing rotation of said second jaw to a first position with respect to said first jaw whereby said semiconductor sample is cleaved and having a second axis of rotation for allowing rotation of said second jaw to a second position with respect to said first jaw whereby said first and second semiconductor bars are positioned so that said first and second cleaved facets are approximately parallel with respect to one another.

11. The apparatus as recited in claim 10, wherein said second jaw has an original position, wherein said first position is approximately 90 degrees with respect to said original position, and wherein said second position is approximately 180 degrees with respect to said original position.

12. The apparatus as recited in claim 6, wherein said at least one jaw further comprises first and second jaws, and wherein each of said first and second jaws further comprises:
a lower face;
an opposing upper face in spaced relation to said lower face so that at least one side of said semiconductor sample can be held therebetween;
a connector that operably connects said upper and lower faces; and
at least one aligning plate dimensioned to fit between said lower and upper faces so that, when said semiconductor sample is operably positioned between said upper and lower faces of said first and second jaws, said cleaving plane is positioned between said first and second jaws.

13. The apparatus as recited in claim 6, wherein said actuator further comprises at least one arm slidably connected to said frame and laterally movable between a first position, a second position and a third position, said arm being in operable connection with said jaws so that, when said arm slides from said first position to said second position, said jaws cleave said semiconductor sample and when said arm slides from said second position to said third position, said jaws position said first and second semiconductor bars whereby said first and second cleaved facets are approximately parallel with respect to one another.

14. A method for processing a laser, said method for use with at least one semiconductor sample having at least one cleaving plane, each cleaving plane having a first side with respect thereto and an opposing second side with respect thereto, said method comprising the steps of:
holding at least one of said first and second sides of said semiconductor sample with at least one holder; and
rotating said holder so that at least one of said first and second sides is rotated with respect to the other side and with respect to their corresponding cleaving plane whereby said semiconductor sample is cleaved along said cleaving plane thereby forming a first semiconductor bar having a first cleaved facet and a second semiconductor bar having a second cleaved facet and so that said first and second semiconductor bars are positioned whereby a coating can be formed on said first and second facets without further movement of said first and second semiconductor bars.

15. The method as recited in claim 14, wherein said rotating step further comprises the steps of:
rotating said first side of said semiconductor sample to a first position with respect to said second side of said semiconductor sample whereby said semiconductor sample is cleaved along said cleaving plane; and then
rotating said first semiconductor bar to a second position with respect to said second semiconductor bar whereby said first and second semiconductor bars are positioned so that said first and second cleaved facets are approximately parallel with respect to each other.

16. The method as recited in claim 14, wherein said holder further comprises a first holder rotatably connected to said frame and a second holder rotatably connected to said frame, said first holder holding said first semiconductor sample side and said second holder holding said second semiconductor side, and wherein said rotating step further comprises the steps of:
rotating said first holder about a first axis of rotation in a first direction; and
rotating said second holder about a second axis of rotation approximately parallel to said first axis of rotation in a second direction opposite from said first direction.

17. The method as recited in claim 14, wherein said holder further comprises a first holder rotatably connected to said frame and a second holder fixably connected to said frame, said first holder holding said first semiconductor sample side and said second holder holding said second semiconductor side, and wherein said rotating step further comprises the steps of:
rotating said first holder about a first axis of rotation with respect to said second holder whereby said semiconductor sample is cleaved along said cleaving plane; and then
rotating said first holder about a second axis of rotation approximately parallel to said first axis of rotation with respect to said second holder so that said first and second semiconductor bars are positioned whereby said first and second cleaved facets are approximately parallel with respect to one another.

18. The method as recited in claim 14, wherein said rotating step cleaves said semiconductor sample and positions said first and second semiconductor bars within 1.00 seconds.

19. The method as recited in claim 14, further comprising the step of positioning said holder and said semiconductor sample within a high vacuum environment after said holding step but prior to said rotating step, said high vacuum environment being at least approximately $10^{-7}$ torr.

20. The method as recited in claim 14, further comprising the step of coating said cleaved facets.

21. The method as recited in claim 14, further comprising, prior to said rotating step, the steps of:
positioning said holder and said semiconductor sample within a vacuum processing chamber; and
introducing a coating medium into said processing chamber.

22. A method for processing a laser, comprising the steps of:
preparing a semiconductor laser sample;
introducing said laser sample into a processing chamber comprising means for generating a coating medium;
introducing into said processing chamber a coating medium from said generating means; and
cleaving said laser sample so that a first and a second cleaved facet are formed whereby at least one of said first and second facets is exposed to the coating medium substantially from the moment of cleaving said laser sample so that contamination of said at least one laser facet is substantially avoided.

23. The method as recited in claim 22, wherein the vacuum pressure in said processing chamber is approximately $10^{-7}$ torr or more.

24. The method as recited in claim 22, wherein said coating medium is an Si beam from an evaporation source.

* * * * *